(12) United States Patent
Tumin et al.

(10) Patent No.: US 7,274,203 B2
(45) Date of Patent: Sep. 25, 2007

(54) DESIGN-FOR-TEST CIRCUIT FOR LOW PIN COUNT DEVICES

(75) Inventors: Kenneth P. Tumin, Austin, TX (US);
George E. Baker, Austin, TX (US);
Dale J. McQuirk, Austin, TX (US);
Matthew G. Stout, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 178 days.

(21) Appl. No.: 11/257,706

(22) Filed: Oct. 25, 2005

(65) Prior Publication Data

US 2007/0090848 A1   Apr. 26, 2007

(51) Int. Cl.
*G01R 31/28* (2006.01)

(52) U.S. Cl. .................. 324/765; 324/763; 714/733
(58) Field of Classification Search ............ None
See application file for complete search history.

(56) References Cited

U.S. PATENT DOCUMENTS

| | | | |
|---|---|---|---|
| 4,733,168 A | | 3/1988 | Blankenship et al. |
| 4,947,395 A | | 8/1990 | Bullinger et al. |
| 5,057,774 A | * | 10/1991 | Verhelst et al. .......... 324/537 |
| 5,371,457 A | * | 12/1994 | Lipp ...................... 324/158.1 |
| 5,467,026 A | * | 11/1995 | Arnold ........................ 326/16 |
| 5,644,251 A | * | 7/1997 | Colwell et al. ............... 326/16 |
| 5,786,703 A | | 7/1998 | Purainen |
| 5,805,609 A | | 9/1998 | Mote, Jr. |
| 5,991,910 A | | 11/1999 | Hull et al. |
| 6,043,672 A | * | 3/2000 | Sugasawara ................ 324/765 |
| 6,249,134 B1 | | 6/2001 | Umeki |
| 6,380,753 B1 | | 4/2002 | Lino et al. |

* cited by examiner

*Primary Examiner*—Ernest Karlsen
(74) *Attorney, Agent, or Firm*—Gary R. Stanford

(57) ABSTRACT

A design-for-test (DFT) circuit for an integrated circuit (IC) for enabling accurate quiescent current testing. The IC includes a voltage supply pin, a ground pin and an internal voltage regulator coupled between the voltage supply and ground pins for providing an internal output voltage. The DFT circuit includes a voltage storage device which couples to the voltage regulator to temporarily maintain the internal output voltage when the voltage regulator is disabled. The mode control circuit detects a quiescent current test mode, disables the voltage regulator and decouples the voltage regulator from the voltage storage device when the quiescent current test mode is detected. The DFT circuit may include an enable circuit which generates a freeze signal when the quiescent current test mode is detected, and at least one switch which decouples the voltage regulator from the voltage storage node. The DFT circuit is particularly useful for low pin-count ICs.

20 Claims, 6 Drawing Sheets ised description, and accompanying drawings in which:

DESIGN-FOR-TEST CIRCUIT FOR LOW PIN COUNT DEVICES

BACKGROUND OF THE INVENTION

1. Field of the Invention

The present invention relates in general to design-for-test circuits, and more specifically to a design-for-test circuit that enables industry standard testing including quiescent current testing for low pin count devices including microcontrollers and the like.

2. Description of the Related Art

Various industry standard manufacturing tests are known for testing devices including integrated circuits (ICs) and the like. JTAG or boundary scan testing is relatively common for larger design-for-test (DFT) devices without significant pin count limitations. Scan testing is common for DFT devices which are configured to enable pre-loading of the collective state of the sequential logic of the device. Scan testing can include tests that detect certain faults types, such as stuck-at faults, delay faults, bridging faults, etc. Quiescent current testing, or IDDQ testing, can detect faults or defects that may not be caught by scan testing, such as bridging faults, gate-oxide defects, shorts between any two of the four terminals of a transistor, partial defects that may not affect functionality but that may affect reliability, certain delay faults, certain stuck-open faults, etc.

To conduct scan testing, the IC is configured into a non-user scan test mode and a scan chain sequence is sequentially clocked into an input to load all of the sequential logic. In the scan test mode, every flip-flop (of every register) in the device is serially linked such that the scan chain sequence sequentially propagates to set the state of all flip-flops of the device to set the initial state of the entire device. The device is switched into a quasi-functional mode for at least one clock cycle to exercise the combination logic and the results are sequentially clocked out of an output. The results of each scan test are compared to a predetermined expected value for the scan results. While the results are clocked out, a new scan chain sequence may be clocked in for another test. Any number of scan chain sequences may be used to test as many states as deemed necessary to test the device.

To conduct IDDQ testing, the IC is powered up and placed in a static mode. While in the static state, the quiescent current of the device is measured and compared to a predetermined threshold. A current value below the threshold indicates a passing device. A current value at or above the threshold indicates a failing device. In CMOS logic, P-channel and N-channel devices are coupled together to minimize current flow in either binary logic state. The only current flowing through each device is leakage current if the device is fault-free. The sum total of the leakage current of the fault-free device is determined as the normal quiescent current for that device. Any fault or defect that generates a greater level of current increases the current level over the normal quiescent current level, which is detected when greater than the threshold current level.

It is desired to provide a DFT device on an IC with minimal pin count. Although many complex microprocessors and the like are available with many pins (e.g., hundreds of pins), there are applications requiring microcontrollers with very few pins (e.g., 10 pins or less). The limited number of pins, however, creates problems for testing. The JTAG test methodology requires 4 pins, which is not an option for low pin-count microcontrollers. Scan testing methodology also requires several pins, including a scan input, a scan output, a scan clock input, and a scan enable pin. Also, newer devices are being implemented with low voltage 0.25 micron logic while still requiring a 5 Volt (V) supply voltage. The low voltage logic requires a reduced supply voltage, such as 2.5V or the like, so that the chip must include an internal voltage regulator to convert the higher supply voltage input to the lower voltage level needed for the internal low voltage logic. The voltage regulator consumes a significant level of current and must be turned off or otherwise isolated to ensure reliable IDDQ testing. In one option, a supply voltage pin is provided to the voltage regulator and a separate supply pin is provided to directly source the low voltage devices during testing. In this case, an additional voltage supply pin is required, which is used primarily only for purposes of testing. The inclusion of an additional power supply pin is undesired for low pin-count devices.

BRIEF DESCRIPTION OF THE DRAWINGS

The benefits, features, and advantages of the present invention will become better understood with regard to the following description, and accompanying drawings in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
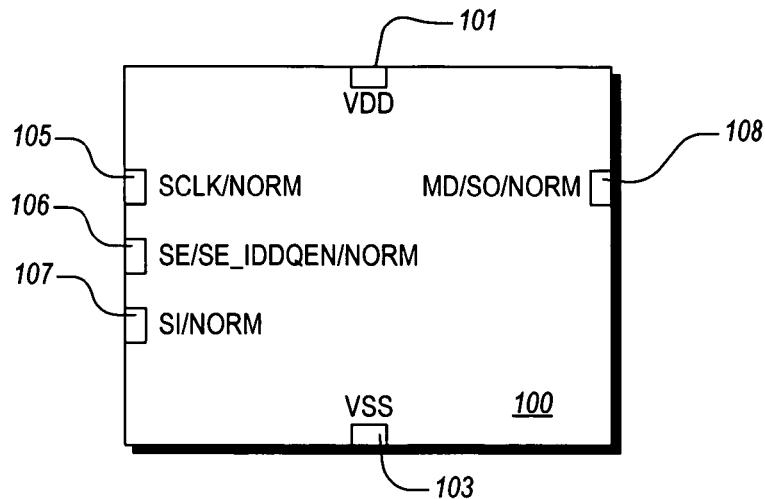
FIG. 1 is a figurative block diagram of an IC device implemented according to an embodiment of the present invention.

FIG. 1 is a figurative block diagram of an IC device 100 implemented according to an embodiment of the present invention. The present invention addresses IC configurations under the severe constraint imposed by an extremely low pin count while also incorporating design-for-test (DFT) circuitry to enable certain industry standard manufacturing tests to be performed at the time of manufacture. In one embodiment, the IC device 100 is a reduced pin-count microcontroller having as few as 6 pins as illustrated (including two power supply pins VDD and VSS as further described below), although the present invention is not limited to the particular function or application implemented on the chip. The IC device 100 is also implemented with a low voltage process, such as the 0.25 micrometer (μm or micron) Complementary Metal-Oxide Semiconductor (CMOS) process or the like. The IC device 100 must operate, however, in an application providing a supply voltage higher than the maximum voltage level allowed for the low voltage circuitry. In one embodiment, for example, the supply voltage provided across VDD and VSS is approximately 5 Volts (V), whereas the internal low voltage circuitry is designed to operate with a supply voltage of approximately 2.5V. The IC device 100 includes a voltage regulator circuit 800 (FIG. 8) which converts the higher supply voltage of VDD to a lower voltage level supply signal VOUT suitable for the low voltage circuitry on the chip.

In the embodiment illustrated, the IC device 100 is designed to perform scan testing, IDDQ (quiescent current) testing, and scan IDDQ testing to ensure IC quality and proper operation. The reduced pin set of the IC device 100 poses a significant challenge to conduct the desired tests including the measurement of the quiescent current of the low voltage circuitry. Scan testing, including IDDQ scan testing, typically requires one or more additional pins to configure the IC for the testing mode and to conduct the tests. Furthermore, the internal voltage regulator circuit 800 draws a significant amount of current which obscures the IDDQ measurement making it difficult if not impossible to obtain an accurate quiescent current determination. Possible solutions include an additional power pin for the voltage regulator to isolate the voltage regulator from the low voltage logic circuitry. The additional pins typically used for scan or IDDQ testing, however, are not available for reduced pin-count applications, including the IC device 100. The IC device 100 is configured to enable the industry standard testing without increasing the pin count.

The IC device 100 includes a voltage supply (VDD) pin 101, a supply reference or ground (VSS) pin 103, and at least four multiplexed functional pins 105, 106, 107 and 108. The functional pins 105-108 are multiplexed pins each having a different function depending upon the mode of operation of the IC device 100. When the IC device 100 is configured into a normal user mode to operate according to its intended application as a microcontroller, the functional pins 105-108 each have a normal (NORM) function as defined according to the design of the microcontroller. Each "NORM" pin functions according to any one (or more) of several typical microcontroller functions, such as a general purpose (GP) pin, a general purpose input/output (GPIO) pin, an analog input or output or input/output (I/O) pin, a clock signal input or output pin, a reset input pin, etc. The particular NORM functions are beyond the scope of the present disclosure and are not further described.

As described further below, the IC device 100 is placed into a test mode in which the functional pins 105-108 are multiplexed to operate as test mode pins. In the test mode, the pin 105 serves as a scan clock (SCLK) pin, the pin 106 serves as a scan enable (SE) pin or alternatively as a dual SE pin and IDDQ enable (SE_IDDQEN) pin, the pin 107 serves as a scan input (SI) pin, and the pin 108 serves as a mode (MD) pin and as a scan output (SO) pin as further described below. As used herein, the name of the pin is changed to reflect the mode of the IC device 100. For example, the pin 106 is referred to as the SE/SE_IDDQEN pin 106 with reference to any test mode, as the SE pin 106 when specifically in a scan test mode (SM), and as the SE_IDDQEN pin 106 when in an IDDQ scan test mode (ISM). As described further below, while enabled by the SE/SE_IDDQEN pin 106, the SI pin 107 receives a scan chain sequence of bits serially shifted into flip-flops within the IC device 100 upon successive cycles of a clock signal on the SCLK pin 105. The VDD and VSS pins 101 and 103 remain as the power supply pins although the voltage provided on the VDD pin 101 may be reduced during IDDQ testing as further described below. In this manner, the functional pins 105-108 and the power supply pins 101 and 103 are the only pins necessary to perform the desired scan testing and IDDQ testing of the IC device 100. Additional pins may be included depending upon the particular needs of the functional circuitry (e.g., microcontroller) and the intended operation and capabilities of the IC device 100. Although the pin 108 is multiplexed between the MD and SO functions, the MD function may be multiplexed with any of the other functional pins 105-107 during any of the selected test modes.

Figure 2:
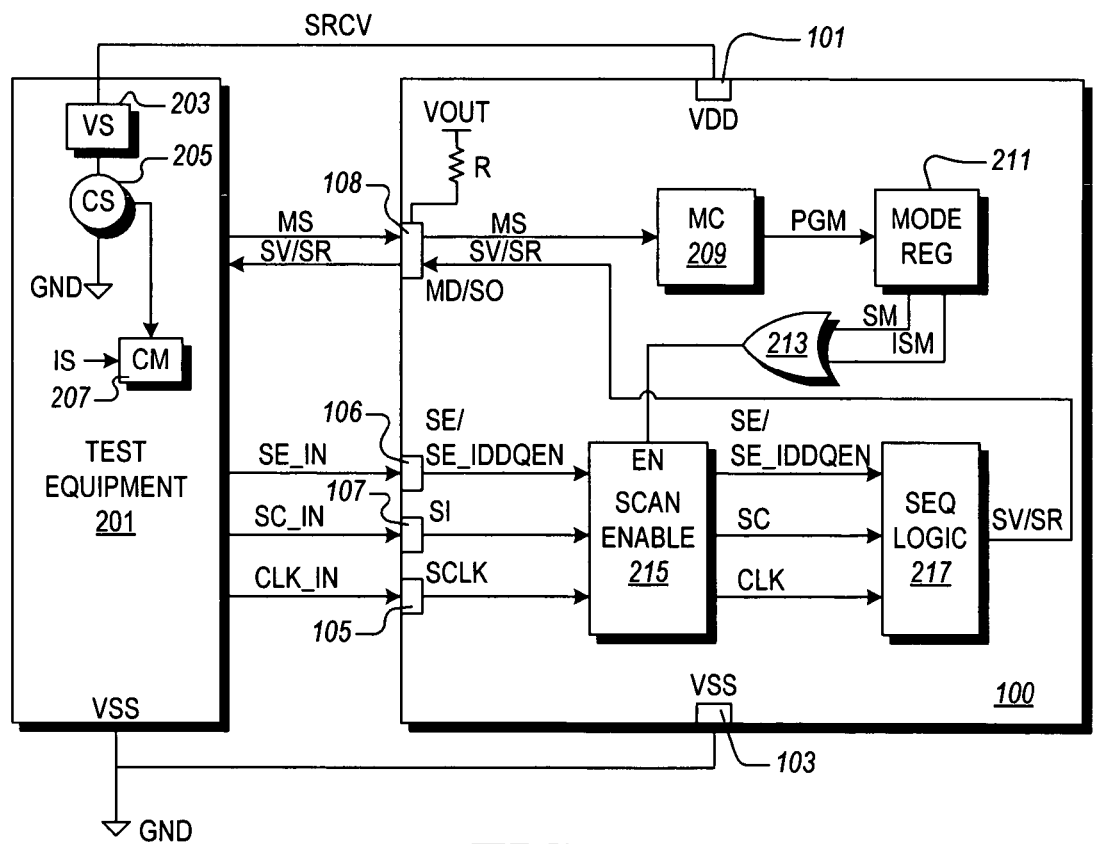
FIG. 2 is a schematic and block diagram of the IC device of FIG. 1 coupled to exemplary test equipment for purposes of performing the desired scan and quiescent current test operations according to an embodiment of the present invention.

FIG. 2 is a schematic and block diagram of the IC device 100 coupled to exemplary test equipment 201 for purposes of performing the desired scan and IDDQ test operations according to an embodiment of the present invention. In a typical configuration, the newly manufactured IC device 100 is plugged into an IC socket (not shown) of the test equipment 201 and the test equipment performs the scan and IDDQ test operations. The test equipment 201 includes an adjustable voltage supply (VS) 203 which provides a source voltage SRCV to the VDD pin 101 of the IC device 100. The test equipment 201 also couples the VSS pin 103 to a reference supply voltage level, such as ground (GND). The IC device 100 is configured to operate within a suitable voltage range provided across the voltage supply pins 101 and 103, such as within a range of approximately 2.7V and 5.5V. The VS 203 is adjustable within the target voltage range to set the level of the supply voltage suitable for the particular test being performed. In one embodiment for scan testing, for example, it is desired to operate the IC device 100 at full power. In scan testing mode, the test equipment 201 sets SRCV to 5V. The IDDQ test typically requires that the IC device 100 be placed into low power mode, although this may be achieved at various levels of VDD. In one embodiment, the test equipment 201 reduces the SRCV signal to a lower voltage, such as 2.7V or the like, to perform the IDDQ test. It is understood that the present invention is not limited to particular voltage levels or voltage ranges and that the particular voltage levels and ranges described herein are exemplary only for purposes of clearly illustrating several embodiments of the present invention. A current sensor (CS) 205 is placed in the current path of the IC device 100 and the voltage source 203 for measuring quiescent current during IDDQ testing. A current measuring (CM) device 207 is shown coupled to the CS 205 for purposes of sampling the quiescent current at the appropriate time for purposes of comparison. In the illustrated embodiment, a current sample signal IS is pulsed high to enable the CM device 207 to capture a current sample. It is appreciated that many alternative methods of current measurement are possible as known to those of ordinary skill in the art.

In the configuration illustrated, the IC device 100 includes an internal pull-up resistor R coupled between the pin 108 and the internal voltage supply signal VOUT. Upon power-on reset (POR), the pin 108 is pulled high by the resistor R causing the IC device 100 to enter its normal operating mode by default. The test equipment 201 provides a mode select signal MS to the pin 108 upon POR to program the IC device 100 into the test mode. When the MS signal is held low during POR, the pin 108 functions as the MD pin 108 which is internally coupled to a mode control (MC) circuit 209. Thus, when the MD pin 108 is held low upon POR, other normal circuitry (not shown) on the IC device 100 is disabled and the MC circuit 209 is instead enabled to program the IC device 100 into the appropriate test mode. After the POR period, the test equipment 201 provides a mode sequence 401 (FIG. 4) on the MS signal via the MD pin 108 to the MC circuit 209, which programs the IC device 100 into the corresponding test mode.

The particular details of the mode sequence 401 are not further described since it may vary significantly depending upon the particular configuration and operation of the IC device 100 and the MC circuit 209. In general, the MS signal is a test mode select signal which is toggled according to a predetermined mode sequence protocol to provide commands and data to the MC circuit 209 for establishing the desired test mode. During the mode sequence 401 and/or soon thereafter, the MC circuit 209 asserts program signals PGM to a mode register 211 within the IC device 100 for programming the IC device 100 into the selected test mode.

It is appreciated that various alternative methods may be used for overriding the normal default mode of the IC device 100 and powering up into the test mode. The pull-up resistor R may instead be a pull-down resistor, in which case the MD pin 108 is pulled high via the MS signal by the test equipment 201 to override the default normal mode. Or, the resistor R may be omitted and the pin 108 may be left in high impedance or tri-state mode for normal default operation or pulled high or low as desired to place the IC device 100 into the test mode. In the general case, the MD pin 108 is asserted to a logic state indicative of a test mode such that the MC circuit 209 is enabled or otherwise configured to receive the mode sequence 401 via the MD pin 108.

As illustrated, the mode register 211 includes a scan mode signal SM and an IDDQ scan mode signal ISM. The scan mode SM signal is asserted high for scan mode testing and is negated low otherwise. The ISM signal is asserted high for IDDQ testing and is negated low otherwise. IDDQ testing includes measuring quiescent current with or without a scan chain sequence for setting the initial state of the IC device 100. The SM and ISM signals are provided to respective inputs of a two-input OR gate 213, having an output coupled to the enable input EN of a scan enable circuit 215. The scan enable circuit 215 is enabled whenever either one of the signals SM or ISM is asserted high (or if both are asserted high) but is otherwise disabled. The scan enable circuit 215 has inputs coupled to the pins 105-107 and outputs coupled to the internal sequential logic 217 of the IC device 100. The MC circuit 209, the mode register 211 and the scan enable circuit 215 collectively form a mode control circuit of the IC device 100 for detecting the test mode and programming the IC device 100 into any of the test modes as described herein. After the IC device 100 is placed into a selected test mode, the functional pins 105-108 become the SCLK pin 105, the SE/SE_IDDQEN pin 106, the SI pin 107 and the SO pin 108, respectively. The test equipment 201 provides an input scan clock signal CLK_IN to the SCLK pin 105, a scan enable input signal SE_IN to the SE/SE_IDDQEN pin 106, and a scan chain sequence input signal SC_IN to the SI pin 107. In the embodiment illustrated, when enabled, the scan enable circuit 215 passes the CLK_IN, SE_IN and SC_IN input signals to corresponding internal signals CLK, SE/SE_IDDQEN and SC, respectively, and when disabled, the scan enable circuit 215 disables its SC and CLK connects to its functional source and pulls the SE/SE_IDDQEN signal low to logic zero (0). The SE/SE_IDDQEN, SC and CLK signals are provided to respective inputs of the sequential logic 217. The sequential logic 217 has an output providing a scan validation signal SV or a scan result signal SR to the SO pin 108, which signals are provided via the SO pin 108 to the test equipment 201. As further described below, the SV signal is provided under certain conditions to validate that the IC device 100 has properly been placed into the selected test mode. The SR signal provides a scan result sequence to the test equipment 201 in response to a scan chain sequence input and quasi-functional test as further described below. It is noted that the SE/SE_IDDQEN pin 106 and the SE/SE_IDDQEN signal are referred to as the SE pin 106 and SE signal, respectively when the SM signal is high, and are referred to as the SE_IDDQEN pin 106 and SE_IDDQEN signal, respectively, when the ISM signal is high.

The SM and ISM signals are mutually exclusive in that only one is asserted at any time. In an alternative embodiment, a single signal may be used to select between the different test modes. Also, additional test modes and corresponding test mode signals may be defined in alternative embodiments.

Figure 3:
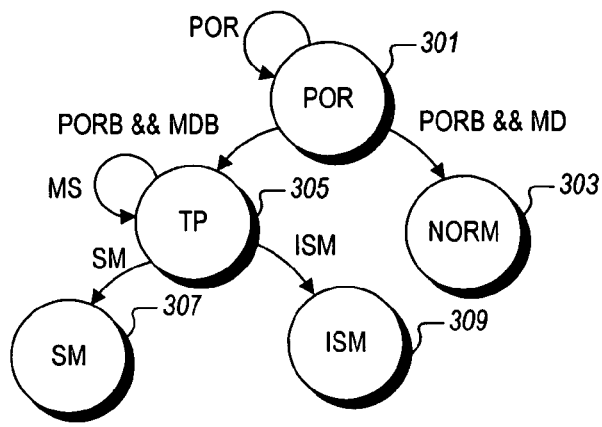
FIG. 3 is a simplified state diagram of the IC device of FIG. 1 during POR for controlling the mode of operation.

FIG. 3 is a simplified state diagram of the IC device 100 during POR for controlling the mode of operation. The IC device 100 powers up into an initial POR state 301 and remains in the POR state 301 while a POR signal is asserted high. When the POR signal is negated low (indicated by a signal PORB going high), if the MD pin 108 is also high the IC device 100 transitions to a normal state 303 as indicated by the condition PORB && MD in which "&&" denotes the logic AND operation and in which the PORB signal has the opposite state as the POR signal. In general, a "B" appended at the end of a signal name denotes a negative logic signal relative to the normal signal name unless otherwise specified. If instead the MD pin 108 is pulled low when the POR signal is negated low as indicated by the condition PORB && MDB, the IC device 100 transitions to a test programming (TP) state 305. During the TP state 305, the MC circuit 209 is enabled to receive the MS signal from the test equipment 201. The MS signal is driven with the mode sequence 401 by the test equipment 201 during the TP state 305 and the MC circuit 209 programs the mode register 211 according to the mode sequence 401. After the mode register 211 is programmed, if the SM signal is asserted high, the IC device 100 transitions into a scan testing mode (SM) state 307. If the ISM signal is asserted high, the IC device 100 instead transitions into an IDDQ scan testing mode (ISM) state 309. In both of the states 307 and 309, the MD pin 108 becomes the SO pin 108. In this case the functional pins 105-107 assume the SCLK, SI and SE/SE_IDDQEN functions.

Figure 4:
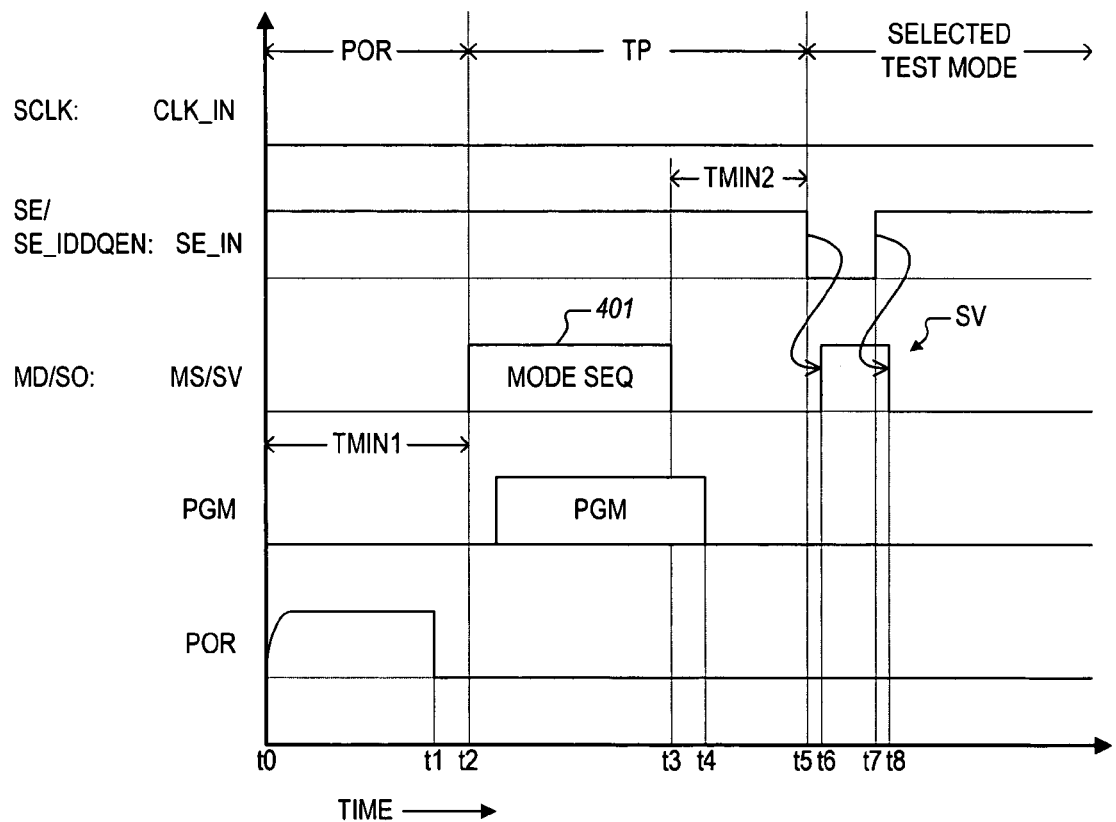
FIG. 4 is a timing diagram illustrating programming the IC device of FIG. 1 into test mode upon POR and validating that test mode has been entered.

FIG. 4 is a timing diagram illustrating programming the IC device 100 into test mode upon POR and validating that test mode has been entered. The timing diagram plots the CLK_IN, SE_IN and MS/SV signals on the SCLK, SE_IDDQEN and MD/SO pins 105, 106 and 108, respectively, along with the internal PGM and POR signals versus time. The test equipment 201 powers up the IC device 100 at a time t0 and the POR signal goes high and stays high during the POR process while in POR state 301. The MS signal provided to the MD pin 108 is initially held low to force the IC device 100 into test mode. The CLK_IN is low at time t0 and kept low throughout the POR sequence and into the test mode after the TP state 305. The SE_IN signal is high during POR and the TP state 305 and into the selected test mode state. Eventually at a time t1, the POR signal goes low indicating that the POR process has completed and the IC device 100 enters the TP state 305. Since the POR signal is not provided externally and there are no other indications that the POR process is completed (especially since pin count is kept at a minimum), the test equipment 201 waits at least a minimum time period TMIN1 from time to t0 a time t2 to ensure that the IC device 100 is out of the POR state 301 and into the TP state 305. It is noted that the POR process may take a variable amount of time, so that the time period TMIN1 is selected to have a duration at least as long as the longest possible POR period.

Beginning at about time t2 until a subsequent time t3, the test equipment 201 provides the mode sequence 401 on the MS signal via the MD pin 108 to the MC circuit 209. As described previously, the mode sequence 401 is generated according to a particular protocol to set the IC device 100 into the desired state. The particular details of the mode sequence 401 are not provided since it is not necessary for a complete understanding of the present invention. During the mode sequence 401 and extending past time t3 to about time t4, the MC circuit 209 provides the PGM signals to program the mode register 211. It is noted that the timing of the PGM signals depends on the particular configuration and that such programming may complete during the mode sequence 401 in another embodiment or may not be started until after the mode sequence 401 in yet another embodiment. In any event, the test equipment 201 waits another predetermined time period TMIN2 from time t3 to about time t5 to ensure sufficient time for the IC device 100 to enter the selected test mode, such as either state 307 or state 309. The MD pin 108 in the TP state 305 becomes the SO pin 108 when entering the selected test mode state. At about time t5, the test equipment 201 toggles the SE_IN signal low until a time t7. The test equipment monitors the response on the SO pin 108 to ensure that the IC device 100 has properly entered the test mode. As described further below, the IC device 100 is configured toggle the SO pin 108 to the opposite state of the SE/SE_IDDQEN pin 106 if in the test mode. As shown, the SO pin 108 goes high at about time t6 in response to the SE_IN signal going low at time t5, and then goes low again at about time t8 in response to the SE_IN signal going high again at time t7. Since the SO pin 108 properly toggled in response to the pulse on the SE_IN signal, the IC device 100 is in a test mode as desired. Otherwise, the IC device 100 is not in the scan test mode or is defective.

Figure 5:
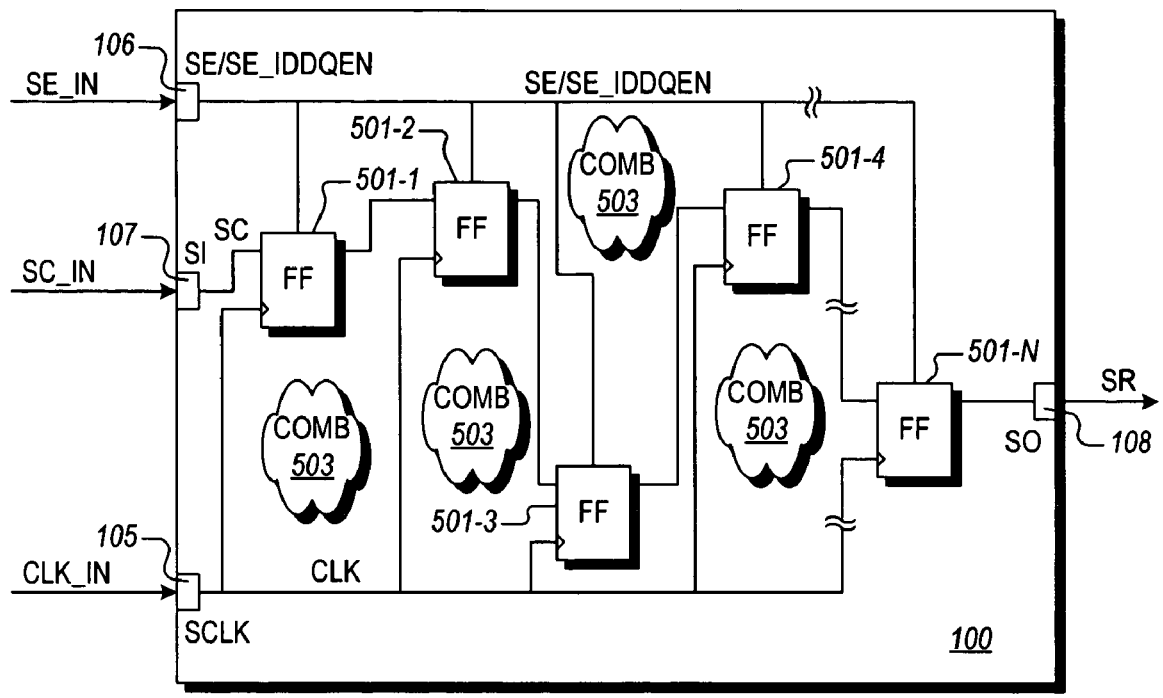
FIG. 5 is a figurative block diagram of the IC device of FIG. 1 during scan testing while in the test mode.

FIG. 5 is a figurative block diagram of the IC device 100 during scan testing while in the test mode. In this case, either one of the SM and ISM signals is asserted high so that the scan enable circuit 215 passes the SE_IN, SC_IN and CLK_IN signals as the SE/SE_IDDQEN, SC and CLK signals, respectively, via the SE/SE_IDDQEN pin 106, the SI pin 107 and the SCLK pin 105, respectively. The SE/SE_IDDQEN signal is distributed to select logic of each of the multiple flip flops 501 within the IC device 100 that form the sequential logic 217. It is noted that the flip flops 501 collectively form the sequential logic 217 of the IC device 100, where it is understood that any other type of storage device is contemplated, such as latches or other memory devices, etc. In the illustrated embodiment, an integer number N flip flops 501 are shown individually labeled 501-1, 501-2, 501-3, . . . , 501-N. As understood by those of ordinary skill in the art, the SE/SE_IDDQEN asserted high causes the flip flops 501 to be coupled in sequential order forming a serial chain between the SI pin 107 and the SO pin 108 when the SE/SE_IDDQEN signal is asserted high according to DFT methodology. In particular, an input of the first flip flop 501-1 is coupled to the SI pin 107 and its output coupled to an input of the second flip flop 501-2, having its output coupled to the input of the third flip flop 501-3, having its output coupled to the input of the fourth flip flop 501-4, and so on up to the last or Nth flip flop 501-N, having its output coupled to the SO pin 108. The flip flops 501 collectively form the sequential logic 217 which defines the state of the IC device 100. The IC device 100 also includes combinational logic 503 which is coupled to the sequential logic 217 during normal operation or when the SE/SE_IDDQEN signal is asserted low in test mode. When the SE/SE_IDDQEN signal is asserted high in test mode, however, the sequential logic 217 is decoupled from the combination logic 503 and reconfigured into the serial chain of flip flops 501-1 to 501-N. Also, the CLK signal is provided to clock inputs of each of the flip flops 501. As described further below, the SO pin 108 provides a scan result output SR upon completion of one iteration during scan testing.

Figure 6:
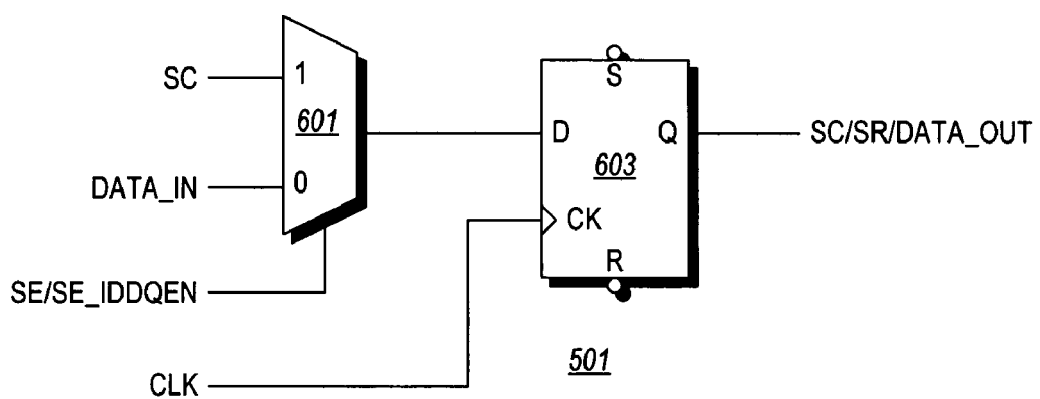
FIG. 6 is a schematic diagram illustrating an exemplary configuration representative of each of the flip flops of FIG. 5.

FIG. 6 is a schematic diagram illustrating an exemplary configuration representative of each of the flip flops 501. Each flip flop 501 includes a multiplexer (MUX) 601 and a D-type flip flop 603. The "1" input of the MUX 601 receives the scan chain SC input and the "0" input of the MUX 601 receives a DATA_IN signal representative of normal operation. The DATA_IN signal is provided from another flip flop 501 of the sequential logic 217 or from an output of the combinational logic 503 based on the particular normal configuration of the IC device 100. The select input of the MUX 601 receives the SE/SE_IDDQEN signal. The output of the MUX 601 is provided to the D input of the D flip flop 603, having a clock input CK receiving the CLK signal. The Q output of the D flip flop 603 provides a shifted scan chain sequence bit SC or a shifted scan result bit SR during scan testing. During normal operation, the Q output of the D flip flop 603 provides a normal data output signal DATA_OUT. The D flip flop 603 may or may not include an inverted set (S) input and an inverted reset (R) input as understood by those skilled in the art. When the SE/SE_IDDQEN signal is driven low, the MUX 601 selects the DATA_IN signal as the D input to the D flip flop 603, which provides the Q output as DATA_OUT. When the SE/SE_IDDQEN signal is driven high, the MUX 601 selects the SC input as the D input to the D flip flop 603, which asserts either the SC or SR output depending upon the status of scan testing. During scan testing, the CLK_IN signal from the test equipment 201 is provided as the CLK signal to the CK input of the D flip flop 603 regardless of the state of the SE/SE_IDDQEN signal. During the normal state 303, the CLK signal is sourced from the user clock source.

Figure 7:
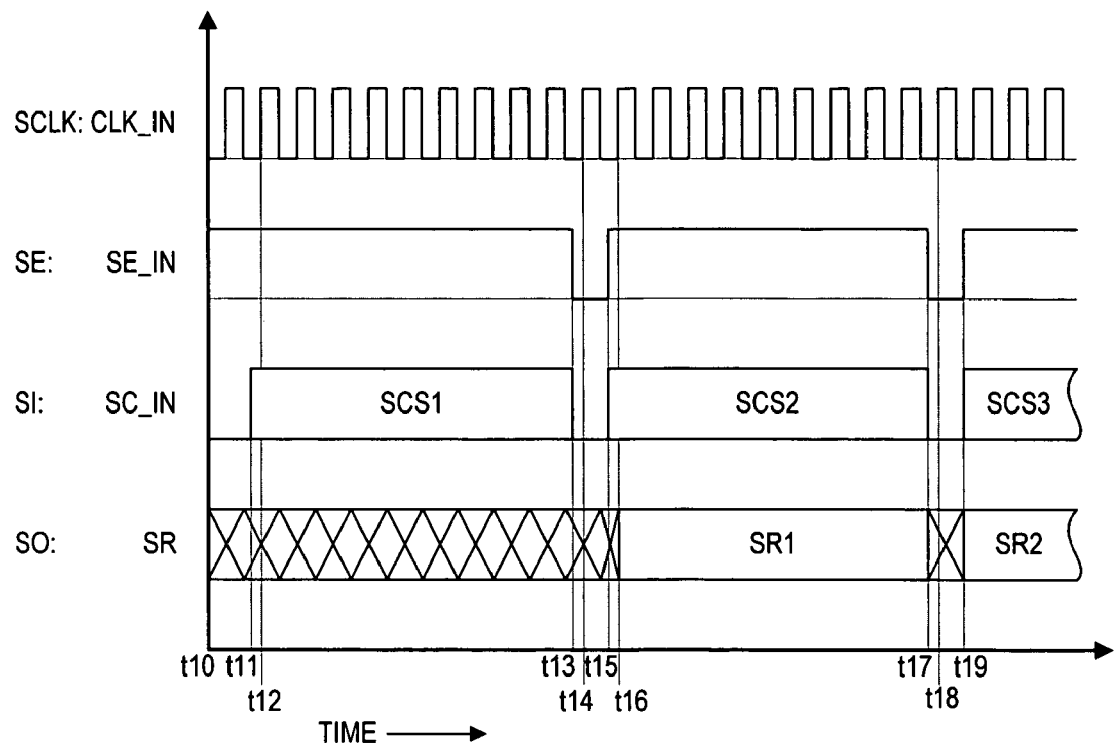
FIG. 7 is a timing diagram illustrating operation of the test equipment of FIG. 2 coupled to the IC device of FIG. 1 during scan testing in the SM scan mode when the SM signal is high.

FIG. 7 is a timing diagram illustrating operation of the test equipment 201 and the IC device 100 during scan testing in the SM scan mode when the SM signal is high. In this case, the SE/SE_IDDQEN pin 106 and the SE/SE_IDDQEN signal are referred to as the SE pin 106 and the SE signal, respectively since in the SM test mode. The timing diagram plots the CLK_IN, SE_IN, SC_IN and SR signals on the SCLK pin 105, the SE pin 106, the SI pin 107 and the SO pin 108, respectively. At a time t10, the SE_IN is held high to enable scan shift operation. Recall from FIG. 6 that the SC input and SC/SR output is selected when the SE signal (which is the same state as the SE_IN signal) is high. The time t10 in FIG. 7 occurs after time t8 of FIG. 4, which is after the IC device 100 has been placed into test mode. The scan testing illustrated in FIG. 7 is for scan mode during state SM 307 although the scan for IDDQ scan testing is similar as described further below. The SC_IN signal is initially low at time t10 although it could alternatively be high or not asserted at all (e.g., tri-stated). The SR signal is unknown (or "don't care") at this time as illustrated with crisscrossed lines. To initiate scan testing, the test equipment 201 drives the SC_IN signal beginning at time t11 just before the next rising edge of the CLK_IN signal at time t12 to serially shift a scan chain sequence SCS1 of N bits into the SI pin 107 of the IC device 100 to establish a predetermined state for testing. The test equipment 201 toggles the CLK_IN signal for each bit of the scan chain sequence SCS1 causing the chain of flip flops 501 to serially shift the bits of the scan chain sequence SCS1 from one flip flop 501 to the next as previously described. The number N of bits in the scan chain sequence SCS1 equals the number N of flip flops 501 of the serial chain of flip flops 501 so that once the entire scan chain sequence SCS1 is shifted in, the state of each flip flop 501 of the IC device 100 is established.

At subsequent time t13, The SE_IN signal is asserted low and the scan chain sequence SCS1 is completed. The SE_IN signal is held low for one or more cycles of the CLK_IN signal until a time t15 so that a rising edge on the CLK_IN signal at an intermediate time t14 occurs while the SE_IN signal is low. In this manner, the scan mode is temporarily disabled to place the IC device 100 in a quasi-functional mode in which the combinational logic 503 and the sequential logic 217 are temporarily placed in normal mode for once cycle of the CLK_IN signal. In this manner, the state of the IC device 100 is predetermined by the scan chain sequence SCS1 and the combined sequential and combinational logic 217 and 503 of the IC device 100 is exercised as though during normal operation for a single clock cycle. When the sequential and combinational logic 217 and 503 of the IC device 100 is exercised in this manner, the scan chain sequence SCS1 is converted to a scan result chain sequence SR1 held in the collective state of the flip flops 501. After the rising edge of the CLK_IN signal at time t14 and before the very next rising edge of the CLK_IN signal at time t16, the test equipment 201 drives the SE_IN signal back high and begins a new scan chain sequence SCS2 at time t15. The test equipment 201 toggles the CLK_IN signal and drives the SI pin 107 with the bits of the next scan chain sequence SCS2 in the same manner as for the first scan chain sequence SCS1. While the next scan chain sequence SCS2 is being serially shifted into the SI pin 107, the first scan result chain sequence SR1 is serially shifted out of the SO pin 108 and provided to the test equipment 201. At subsequent time t17, the scan chain sequence SCS2 is completely shifted into the flip flops 501 of the IC device 100 and the scan result chain sequence SR1 is completely shifted out to the test equipment 201.

At time t17, the test equipment pulls the SE_IN signal low once again and holds SE_IN low for the next rising edge of the CLK_IN signal occurring at time t18. In this manner, the sequential and combinational logic of the IC device 100 is exercised for one clock cycle with the next scan chain sequence SCS2, so that the collective state of the flip flops 501 is converted to the next scan chain result sequence SR2. At next time t19 prior to the next rising edge of the CLK_IN signal, the test equipment 201 re-asserts the SE_IN signal high and begins shifting in the next scan chain sequence SCS3 into the SI pin 107 while the next scan result chain sequence SR2 is serially shifted out to the test equipment 201 via SO pin 108. Operation repeats in this manner for as many scan chain sequences as desired to test operation of the IC device 100.

Figure 8:
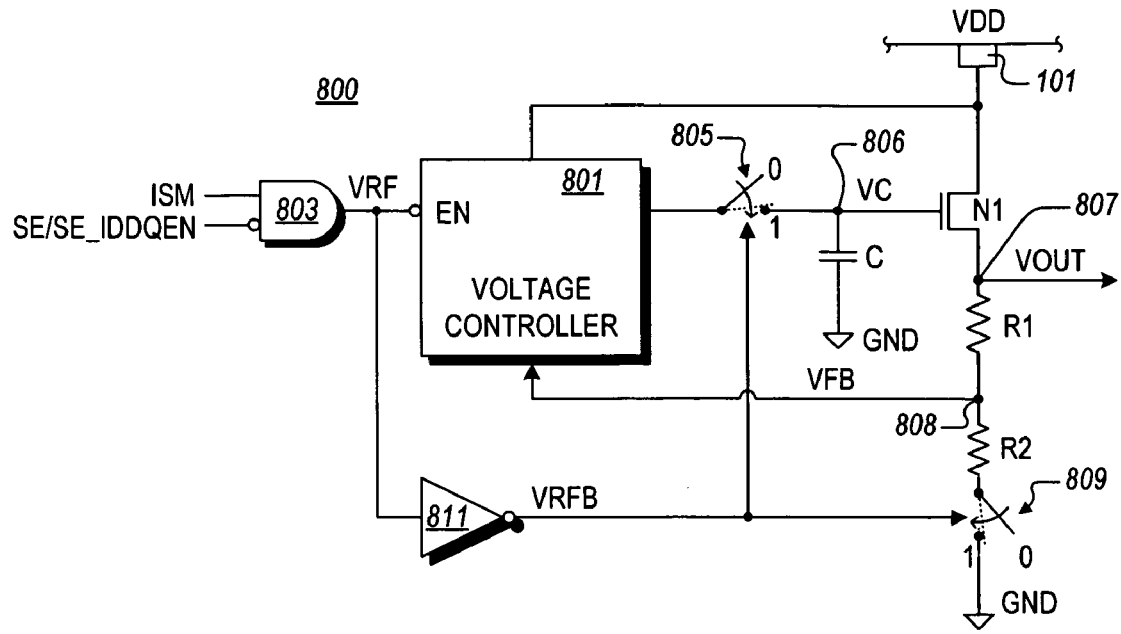
FIG. 8 is a simplified schematic and block diagram of a voltage regulator circuit implemented according to an exemplary embodiment of the present invention and provided on the IC device of FIG. 1.

FIG. 8 is a simplified schematic and block diagram of the voltage regulator circuit 800 implemented according to an exemplary embodiment of the present invention and provided on the IC device 100. The voltage regulator circuit 800 includes a voltage controller 801 which is coupled to the VDD pin 101 to receive the VDD supply voltage. The voltage controller 801 includes an inverting enable input coupled to the output of a two-input AND gate 803. The output of the AND gate 803 provides a voltage regulator freeze signal VRF to the enable input of the voltage controller 801 to disable the voltage regulator during a quiescent current test as further described below. The AND gate 803 has a first non-inverted input receiving the ISM signal and a second inverting input receiving the SE/SE_IDDQEN signal. In the embodiment illustrated, the voltage controller 801 has an output coupled to a first switched terminal of a single-pole, single-throw (SPST) switch 805. The other switched terminal of the switch 805 is coupled to a voltage control or voltage storage node 806 developing a voltage control signal VC. The voltage storage node 806 is coupled to the gate of an N-channel transistor N1 and to one terminal of a capacitor C, which has its other terminal coupled to GND. The drain of N1 is coupled to the VDD pin 101 and its source is coupled to an output node 807 developing the output voltage VOUT serving as the supply voltage to the combinational logic 503 and the sequential logic 217 of the IC device 100.

The output node 807 is coupled to one end of a resistor R1, having its other end coupled to a feedback node 808 and to one end of another resistor R2. The other end of the resistor R2 is coupled to a first switched terminal of another SPST switch 809, having its other switched terminal coupled to GND. The feedback node 808 develops a feedback sense signal or voltage VFB which is provided to a feedback input of the voltage controller 801. The VRF signal is provided to the input of an inverter 811, having an output which develops an inverted voltage regulator freeze signal VRFB, which is provided to the control inputs of the switches 805 and 809. The switches 805 and 809 are depicted as SPST switches, but may be implemented using N-channel or P-channel field-effect transistor (FET) or MOS devices as known to those skilled in the art. The AND gate 803, the inverter 811 and the switches 805 and 809 collectively form a switch circuit controlled by the MC circuit 209 and the mode register 211 to enable the quiescent current test.

During normal operation of the IC device 100, the ISM signal is low so that the AND gate 803 asserts the VRF signal low to enable the voltage controller 801. The VRFB signal is asserted high by the inverter 811, which closes both of the switches 805 and 809. The output of the voltage controller 801 drives the voltage storage node 806 and operates to charge the capacitor C to develop the VC signal at the gate of N1. The transistor N1 operates as a voltage converter which converts the VDD supply voltage to develop the voltage level of the VOUT signal as controlled by the VC signal. The voltage divider resistors R1 and R2 are relatively high valued resistors which draw a relatively low amount of current. The resistors R1 and R2 form a sense circuit which senses the VOUT signal to develop the VFB signal at the feedback node 808. The VFB signal is provided to a feedback input of the voltage controller 801 for purposes of detecting and controlling the voltage level of VOUT. In particular, the voltage controller 801 drives the voltage storage node 806 to maintain VOUT at a desired predetermined voltage level. In one embodiment, VDD is between 2.7V and 5.5V and the voltage controller 801 maintains VOUT at approximately 2.5V suitable for 0.25 micron CMOS circuitry. The output of the voltage controller 801 may be configured according to any one of multiple configurations as known to those skilled in the art, such as for example, providing an output control current to charge the capacitor C, or as a switched capacitor output providing an output voltage to set the voltage of VC to the suitable level to control VOUT, etc.

For IDDQ testing, the voltage controller 801 draws a substantial amount of current as compared to the combined leakage current or the quiescent current of the IC device 100, which would otherwise obscure the quiescent current measurement of the IC device 100. So, the IC device 100 is configured to disable and isolate the voltage controller 801 to enable accurate measurement of the quiescent current for IDDQ testing. When the ISM signal is high, the SE/SE_IDDQEN signal becomes the SE_IDDQEN signal which enables current scan mode when high and quiescent current testing when low. The test equipment 201 asserts the SE_IN signal low to cause the SE_IDDQEN signal to be asserted low for quiescent current testing. Thus, when ISM is high and SE_IDDQEN is low, the AND gate 803 asserts the VRF signal high which disables the voltage controller 801. In that case, the inverter 811 asserts the VRFB signal low to open both of the switches 805 and 809. The output of the voltage controller 801 is decoupled from the voltage storage node 806. Even though the voltage controller 801 is disabled, its output is decoupled from the voltage storage node 806 to prevent any stray or transient currents or voltages from appreciably modifying the voltage level of VC. Also, the switch 809 opens and disables the sense circuit resistors R1 and R2 so that any DC voltage level is isolated from VOUT. In this manner, the voltage controller 801 is completely isolated from the remaining logic and circuitry of the IC device 100 and does not draw significant current from the VDD pin 101. The capacitor C holds the voltage of the voltage storage node 806 to maintain VOUT at the predetermined voltage level for a sufficient amount of time to perform the quiescent current test. In this manner, the CM device 207 of the test equipment 201 is able to make an accurate quiescent current measurement of the IC device 100.

For IDDQ scan testing, the test equipment 201 asserts the SE_IN signal high to assert the SE_IDDQEN signal high. In that case, even if the ISM signal is high, the VRF signal is low and the VRFB signal is high so that the voltage controller 801 is enabled and the switches 805 and 809 are closed. The test equipment 201 is able to shift in a scan chain sequence as further described below to preset the collective state of the sequential logic 217 in substantially the same manner as described above for scan mode testing. This enables the test equipment 201 to establish a defined state of the IC device 100 for purposes of IDDQ testing in that different states uncover defects in different portions of the combinational logic 503 and the sequential logic 217 of the IC device 100. Then the test equipment 201 asserts the SE_IN signal low to assert the SE_IDDQEN signal low to disable and isolate the voltage controller 801 and to enable an accurate IDDQ test.

Figure 9:
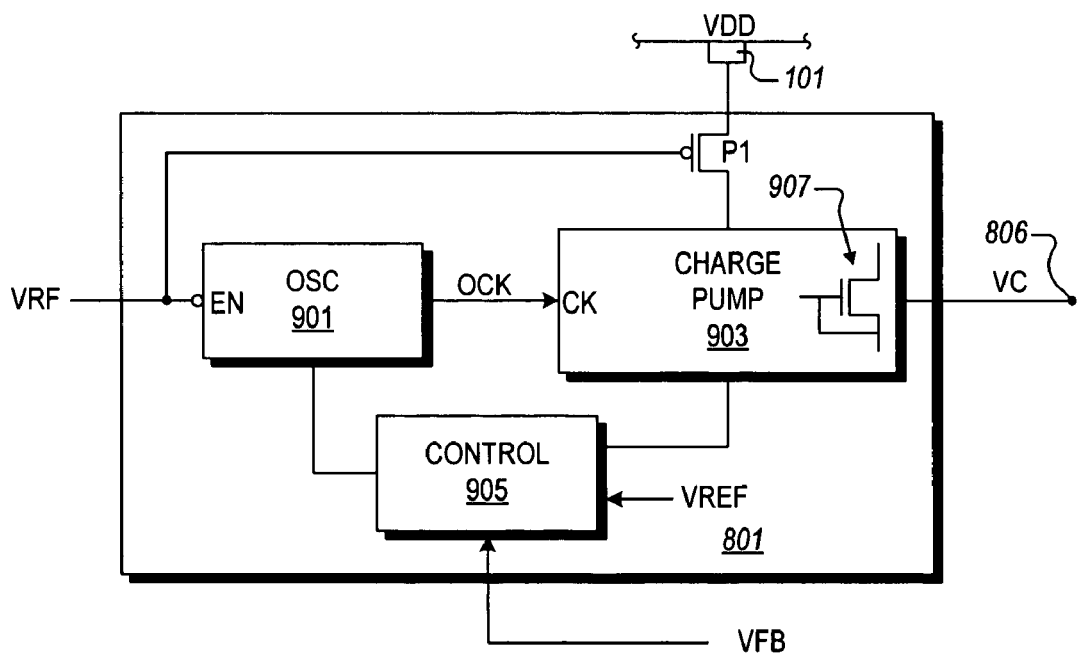
FIG. 9 is a more detailed schematic and block diagram of one embodiment of the voltage controller of FIG. 8 according to an exemplary embodiment of the present invention.

FIG. 9 is a more detailed schematic and block diagram of one embodiment of the voltage controller 801 according to an exemplary embodiment of the present invention. The VRF signal is provided to the inverted enable input of an internal oscillator circuit 901 and to the gate of an internal P-channel transistor P1. The source of P1 is coupled to the VDD pin 101 and its drain is coupled to a supply input of an internal charge pump circuit 903. The oscillator circuit 901 has an output providing a clock signal OCK to a clock input of the charge pump 903, which has an output for driving the VC signal of the voltage storage node 806. An internal control circuit 905 receives the VFB signal and controls either or both the oscillator circuit 901 and the charge pump circuit 903 to regulate the voltage level of VOUT. When the VRF signal is low during normal operation, the oscillator circuit 901 is enabled to provide the OCK signal, and P1 is turned on to provide supply voltage to the charge pump circuit 903. The charge pump circuit 903 drives the voltage storage node 806 during normal operation. In one embodiment, the resistors R1 and R2 divide the voltage of VOUT to obtain a voltage level of VFB that equals a reference voltage VREF (e.g., bandgap voltage or the like) provided to the control circuit 905 when VOUT is at the proper voltage level using negative feedback. When the VRF signal is asserted high for IDDQ testing, the oscillator circuit 901 is disabled and P1 is turned off to remove the charge pump 903 from its power source. In the case illustrated in FIG. 9, the switch 805 is replaced with an output device 907 of the charge pump circuit 903 to isolate it from the voltage storage node 806. In the embodiment shown, the output device 907 is configured as a diode-coupled N-channel transistor which tri-states its output when the voltage controller 801 is disabled. The transistor P1 functions to isolate the charge pump circuit 903 from the VDD pin 101 to prevent any additional current flow to further improve the quiescent current measurement.

Figure 10:
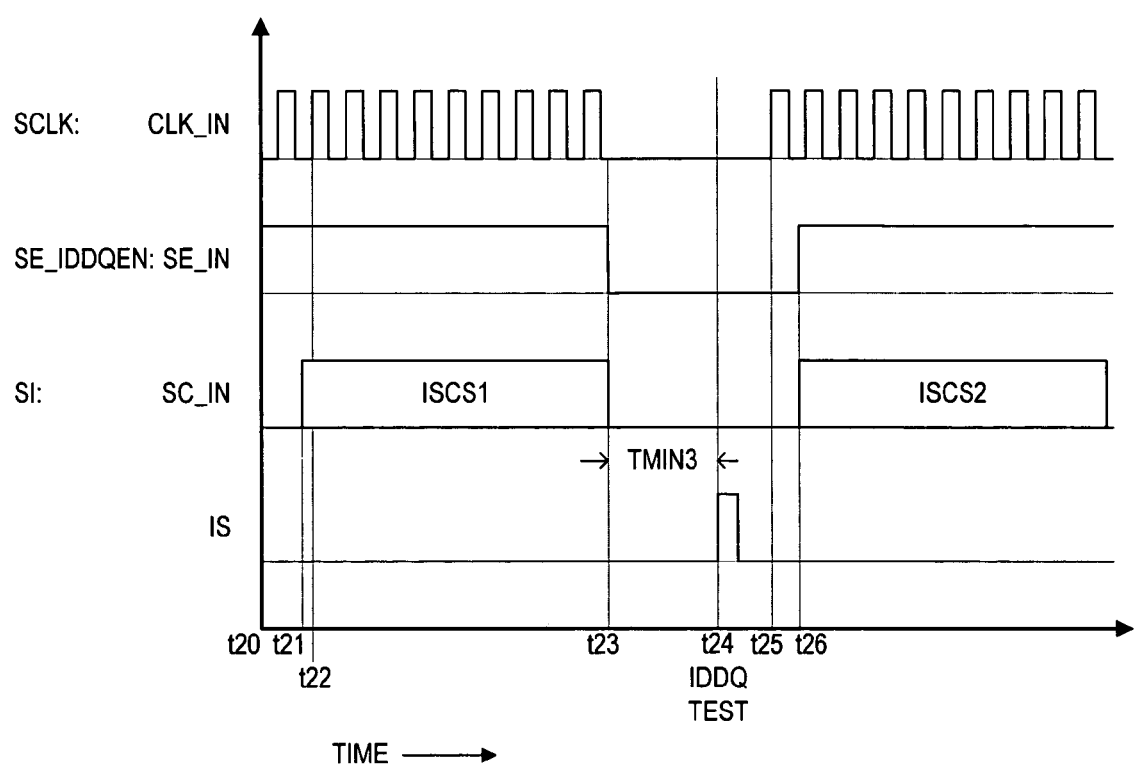
FIG. 10 is timing diagram illustrating scan mode for quiescent current testing.

FIG. 10 is timing diagram illustrating scan mode for IDDQ testing beginning at a time t20. The timing diagram plots the CLK_IN, SE_IN, SC_IN and IS signals versus time. Prior to time t20, the test equipment 201 configured the IC device 100 in the ISM test mode so that the ISM signal is high at time t20. The SE_IN signal is provided by the test equipment 201 to the SE_IDDQEN pin 106 of the IC device 100, which causes the SE_IDDQEN signal within the IC device 100 to assume the same state as the SE_IN signal, so that the test equipment 201 controls the state of the SE_IDDQEN via the SE_IN signal. At time t20, the test equipment 201 asserts the SE_IDDQEN signal high and pulls the IS signal (within the test equipment 201) low. The test equipment 201 provides an IDDQ scan chain sequence ISCS1 beginning at a time t21 before a next rising edge of the CLK_IN signal at time t22, and then toggles the CLK_IN signal to serially shift the IDDQ scan chain sequence ISCS1 into the flip flops 501 in a similar manner as for the scan chain sequence SCS1 as previously described. In fact, the IDDQ scan chain sequence ISCS1 has N bits and the serial shift operation is substantially identical as described for the scan chain sequence SCS1, except that the individual bits of the IDDQ scan chain sequence ISCS1 are selected to set the collective state of the flip flops 501 of the IC device 100 to a state suitable for the particular IDDQ test to be performed. The test equipment 201 asserts the SE_IDDQEN signal low and completes the IDDQ scan chain sequence ISCS1 at subsequent time t23 to initiate the IDDQ test. Also, the test equipment 201 temporarily suspends the CLK_IN signal after time t23 while the IDDQ test is performed. Just after time t23, the IDDQ scan chain sequence ISCS1 has been completely shifted into the serially coupled flip flops 501 to set the collective state of the IC device 100. While the SE_IDDQEN is asserted low and the ISM signal is high, the voltage controller 801 is disabled as previously described.

When the SE_IDDQEN signal is asserted low and while the CLK_IN signal is temporarily suspended, the proper condition for the IDDQ test is established. After a predetermined minimum time period TMIN3 from time t23 to a subsequent time t24, the test equipment 201 pulses the IS signal high at time t24 to take a sample of the quiescent current of the IC device 100. The time period TMIN3 has a sufficient duration after time t23 to ensure that the circuitry of the IC device 100 has stabilized and that any and all transients have died down to enable accurate measurement of the quiescent current. After the current sample is taken, the test equipment 201 may initiate another IDDQ test for a different IDDQ scan chain sequence ISCS2. At time t25, the test equipment 201 re-starts the CLK_IN signal and at subsequent time t26, the test equipment 201 asserts the SE_IDDQEN signal high and begins shifting in the next IDDQ scan chain sequence ISCS2. Operation continues in this manner for as many IDDQ tests as desired. It is appreciated that the IDDQ test may be conducted without scanning in a chain of bits. For the scan-less IDDQ test, the test equipment 201 halts the CLK_IN signal once in the ISM test mode, asserts the SE_IDDQEN signal low, waits for the time period TMIN3 to elapse, and then pulses the IS signal to sample the quiescent current.

Figure 11:
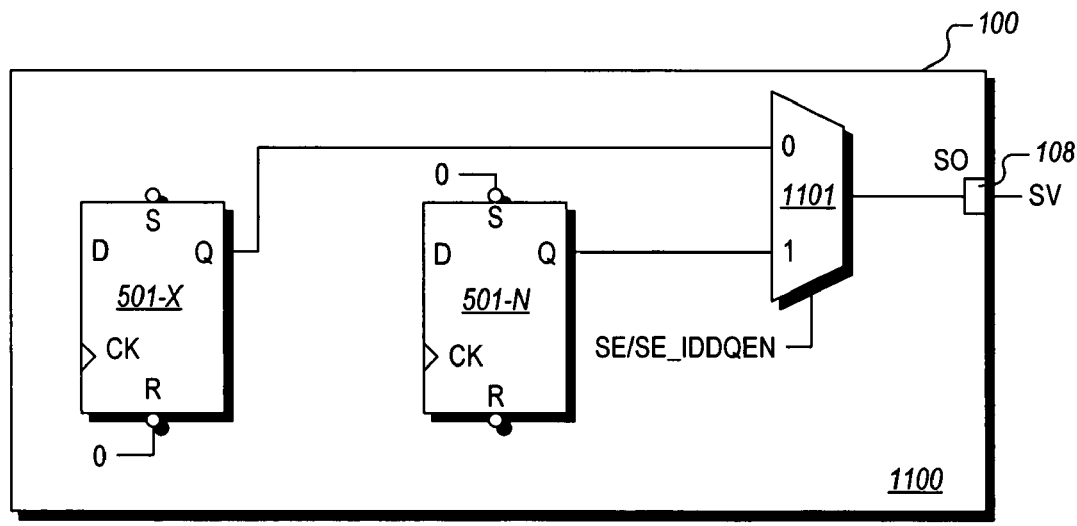
FIG. 11 is a schematic diagram of validation circuitry within the IC device of FIG. 1 for purposes of validating that the IC device is placed into scan test mode.

FIG. 11 is a schematic diagram of validation circuitry 1100 within the IC device 100 for purposes of validating that the IC device 100 is placed into scan test mode. A MUX 1101 has its "0" input coupled to the Q output of any one of the intermediate flip flops 501 of the sequential logic 217 which provides the signal on the function pin 108 during normal operation. As illustrated, the selected flip flop is labeled 501-X. The inverted reset input of the flip flop 501-X is coupled to a logic zero (0) so that upon power up, the flip flop 501-X initially asserts its output at a logic zero (0) level. The "1" input of the MUX 1101 has its "1" input coupled to the Q output of the last flip flop 501-N of the serial chain of flip flops 501 when the SE/SE_IDDQEN signal is high. The inverted set input of the flip flop 501-N is coupled to a logic zero (0) so that upon power up, the flip flop 501-N initially asserts its output at a logic one (1) level. Alternatively, the initial states of the flip flops 501-X and 501-N may be reversed if desired. The output of the MUX 1101 is coupled to the SO pin 108. The SE/SE_IDDQEN signal is provided to the select input of the MUX 1101. In this manner, the MUX 1101 operates to switch the function of the pin 108 between the normal mode and the test modes. If the IC device 100 is properly placed into either test mode SM or ISM, then the scan enable logic 215 is enabled and the SE/SE_IDDQEN signal is provided to each flip flop 501 and to the MUX 1101. Since the flip flops 501-X and 501-N are initialized to opposite logic states, the test equipment 201 toggles the SE_IN signal to validate that the IC device 100 is in either test mode SM or ISM, which causes the SO pin 108 to toggle the SV signal in response if the IC device 100 is in either test mode. This was illustrated as the SV signal pulsing high between times t6 and t8 in response to the SE_IN signal pulsed low between times t5 and t7 in the timing diagram of FIG. 4. When the IC device 100 is in the normal state 303, the scan enable circuit 215 holds the SE/SE_IDDQEN signal low so that the MUX 1101 selects the Q output of the flip flop 501-X to drive the pin 108 for normal operation.

A design-for-test (DFT) circuit according to an embodiment of the present invention is disclosed for an integrated circuit (IC) for enabling accurate quiescent current testing. The IC includes a single voltage supply pin, a ground pin and an internal voltage regulator coupled between the voltage supply and ground pins for providing an internal output voltage. The DFT circuit includes a voltage storage device which couples to the voltage regulator to temporarily maintain the internal output voltage when the voltage regulator is disabled. The mode control circuit detects a quiescent current test mode, disables the voltage regulator and decouples the voltage regulator from the voltage storage device when the quiescent current test mode is detected. In one embodiment, the voltage storage device comprises a capacitor which temporarily holds the voltage sufficient for quiescent current testing. The DFT circuit may include an enable circuit which generates a freeze signal when the quiescent current test mode is detected, and at least one switch which decouples the voltage regulator from the voltage storage node.

An IC according to an embodiment of the present invention includes a supply pin, a voltage storage node, a voltage converter, a voltage controller, and a switch circuit. The voltage converter has a first input coupled to the supply pin, a second input coupled to the voltage storage node, and an output providing a supply voltage for internal low voltage circuitry. The voltage controller has a supply input coupled to the supply pin, an output that drives the voltage storage node to regulate the output of the voltage converter to a predetermined voltage level, and an enable input responsive to a freeze signal that disables the voltage controller when the freeze signal indicates a quiescent current test. The switch circuit decouples the output of the voltage controller from the voltage storage node when the freeze signal indicates the quiescent current test. In this manner, the voltage storage node maintains voltage sufficient for the quiescent current test when the voltage controller is decoupled.

The IC may include a sense circuit which is coupled to the voltage converter and which has a sense node that develops a sense signal indicative of the output of the voltage converter. The voltage controller may include a feedback input coupled to the sense node. In this case, the switch circuit may include a first switch that selectively disables the sense circuit based on the freeze signal, and a second switch that selectively couples the output of the voltage controller to the voltage storage node based on the freeze signal.

In one embodiment, the voltage controller may include an oscillator circuit and a charge pump. The oscillator circuit has an enable input receiving the freeze signal and an output providing an oscillation signal when enabled. The charge pump includes a clock input coupled to the oscillator circuit output and an output that drives the voltage storage node when the voltage controller is enabled. The switch circuit may partly be implemented within the charge pump as an output device which tri-states the charge pump output when the voltage controller is disabled. The IC may further include a sense circuit which is coupled to the voltage converter and which has a sense node that develops a sense signal indicative of the output of the voltage converter. In this case, the voltage controller has a feedback input coupled to the sense node, and the switch circuit includes a switch that selectively disables the sense circuit based on the freeze signal.

The IC may further include a first multiplexed pin that is externally driven to a test state to indicate at least one test mode, and a mode control circuit which having an input coupled to the first multiplexed pin. The mode control circuit detects the first multiplexed pin being driven to the test state and programs the IC into a selected test mode in response to an external mode select signal provided via the first multiplexed pin. The mode control circuit switches the first multiplexed pin to operate as a test function pin when the IC is programmed into at least one test mode. The IC may further include a second multiplexed pin, sequential logic including first and second storage devices and a multiplexer. The first storage device has an output providing a first default logic state and the second storage device has an output providing a second and opposite default logic state. The multiplexer has a first selectable input coupled to the output of the first storage device, a second selectable input coupled to the output of the second storage device, a select input coupled to the second multiplexed pin when the IC is programmed into at least one test mode, and an output coupled to the first multiplexed pin. In this manner, the test modes are validated when a validation signal applied to the second multiplexed pin is indicated by the first multiplexed pin.

The IC may include a mode control circuit current test enable logic. The mode control circuit programs the IC into a selected one of a scan test mode and a current test scan mode and a multiplexed pin that is programmed as a scan enable pin when the IC is programmed into the scan test mode and that is programmed as a current test scan enable pin when the IC is programmed into the current test scan mode. In one embodiment, the mode control circuit is configured to program the IC into a current scan mode when the multiplexed pin is asserted to a first logic state and to enable the quiescent current test when the multiplexed pin is asserted to a second logic state when the IC is programmed into the current test scan mode. The current test enable logic has inputs coupled to the mode control circuit and the multiplexed pin and an output providing the freeze signal, where the current test enable logic asserts the freeze signal to enable the quiescent current test when the IC is programmed into the current test scan mode and when the multiplexed pin is asserted to the second logic state.

A method of configuring an IC to enable quiescent current measurement via a single supply pin relative to a reference pin according to an embodiment of the present invention includes providing a voltage converter that converts a supply voltage received via the supply pin to an internal output voltage at a predetermined voltage level as controlled by a control voltage, providing a voltage control node that develops the control voltage when driven and that temporarily maintains the control voltage sufficient for the quiescent current measurement when not driven, providing a voltage controller that is coupled to the single supply pin and that drives the voltage control node to regulate the internal output voltage at the predetermined voltage level, and providing a test mode circuit that detects a quiescent current test mode, that disables the voltage controller and that decouples the voltage controller from the voltage control node to enable the quiescent current measurement when the quiescent current test mode is detected.

The method may include providing a sense circuit that is coupled to the voltage converter to provide a feedback sense voltage to the voltage controller, and configuring the test mode circuit to disable the sense circuit from providing the feedback sense voltage when the quiescent current test mode is detected. The method may include configuring the voltage controller to tri-state its output driving the voltage control node when the voltage controller is disabled. The method may include coupling a capacitor to the voltage control node.

The method may include coupling a first multiplexed pin on the IC to the test mode circuit, and configuring the test mode circuit to enable the IC to be programmed via the first multiplexed pin into at least one test mode including a current test mode for enabling the quiescent current measurement, and to switch the first multiplexed pin to operate as a test function pin after the IC is programmed into at least one test mode. The method may further include providing a second multiplexed pin, presetting a first storage device of sequential logic of the IC to output a first logic state, presetting a second storage device of the sequential logic of the IC to output a second logic state which is different from the first logic state, coupling the second multiplexed pin to select logic when the IC is programmed into at least one test mode, and configuring the select logic to select between the outputs of the first and second storage devices based on a test mode validation signal provided on the second multiplexed pin and to provide the selected output to the first multiplexed pin when the IC is programmed into at least one test mode.

The method may include configuring the test mode circuit to program the IC into a selected one of a scan test mode and at least one current test mode including the quiescent current test mode, and providing a multiplexed pin to operate as a scan enable pin when the IC is programmed into the scan test mode and to operate as a current test enable pin when the IC is programmed into at least one current test mode. The method may include configuring the test mode circuit to operate the IC in a current scan mode when the multiplexed pin is asserted to a first logic state and to enable the quiescent current test mode when the multiplexed pin is asserted to a second logic state when the IC is programmed into at least one current test mode.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

The invention claimed is:

1. A design-for-test (DFT) circuit for an integrated circuit (IC) with a voltage supply pin, a ground pin and an internal voltage regulator coupled between the voltage supply and ground pins for providing an internal output voltage, said DFT circuit comprising:
   a voltage storage device for coupling to the internal voltage regulator to temporarily maintain the internal output voltage when the internal voltage regulator is disabled; and
   a mode control circuit that detects a quiescent current test mode and which disables the internal voltage regulator and decouples the internal voltage regulator from said voltage storage device when said quiescent current test mode is detected.

2. The DFT circuit of claim 1, wherein said voltage storage device comprises a capacitor.

3. The DFT circuit of claim 1, wherein said mode control circuit comprises:
   an enable circuit which generates a freeze signal when said quiescent current test mode is detected; and at least one switch which decouples the internal voltage regulator from said voltage storage device in response to said freeze signal.

4. An integrated circuit (IC), comprising:
a supply pin;
a voltage storage node;
a voltage converter having a first input coupled to said supply pin, a second input coupled to said voltage storage node, and an output providing a supply voltage for internal low voltage circuitry;
a voltage controller having a supply input coupled to said supply pin, an output that drives said voltage storage node to regulate said output of said voltage converter to a predetermined voltage level, and an enable input responsive to a freeze signal that disables said voltage controller when said freeze signal indicates a quiescent current test; and
a switch circuit that decouples said output of said voltage controller from said voltage storage node when said freeze signal indicates said quiescent current test;
wherein said voltage storage node maintains voltage sufficient for said quiescent current test when said voltage controller is decoupled.

5. The IC of claim 4, further comprising:
a sense circuit coupled to said voltage converter and having a sense node that develops a sense signal indicative of said output of said voltage converter;
said voltage controller having a feedback input coupled to said sense node; and
wherein said switch circuit comprises:
 a first switch that selectively disables said sense circuit based on said freeze signal; and
 a second switch that selectively couples said output of said voltage controller to said voltage storage node based on said freeze signal.

6. The IC of claim 4, wherein said voltage controller comprises:
an oscillator circuit comprising an enable input receiving said freeze signal and an output providing an oscillation signal when enabled;
a charge pump comprising a clock input coupled to said oscillator circuit output and an output that drives voltage storage node when said voltage controller is enabled; and
wherein said switch circuit comprises an output device of said charge pump that tri-states said charge pump output when said voltage controller is disabled.

7. The IC of claim 6, further comprising:
a sense circuit coupled to said voltage converter and having a sense node that develops a sense signal indicative of said output of said voltage converter;
said voltage controller having a feedback input coupled to said sense node; and
wherein said switch circuit comprises a switch that selectively disables said sense circuit based on said freeze signal.

8. The IC of claim 4, further comprising a capacitor coupled to said voltage storage node.

9. The IC of claim 4, further comprising:
a first multiplexed pin that is externally driven to a test state to indicate at least one test mode; and
a mode control circuit, having an input coupled to said first multiplexed pin, that detects said first multiplexed pin being driven to said test state and that programs the IC into a selected one of said at least one test mode in response to an external mode select signal provided via said first multiplexed pin;
wherein said mode control circuit switches said first multiplexed pin to operate as a test function pin when the IC is programmed into said at least one test mode.

10. The IC of claim 9, further comprising:
a second multiplexed pin;
sequential logic comprising first and second storage devices wherein said first storage device has an output providing a first default logic state and said second storage device has an output providing a second and opposite default logic state; and
a multiplexer having a first selectable input coupled to said output of said first storage device, a second selectable input coupled to said output of said second storage device, a select input coupled to said second multiplexed pin when the IC is programmed into said at least one test mode, and an output coupled to said first multiplexed pin;
wherein said at least one test mode is validated if a validation signal applied to said second multiplexed pin is indicated by said first multiplexed pin.

11. The IC of claim 4, further comprising:
a mode control circuit that programs the IC into a selected one of a scan test mode and a current test scan mode; and
a multiplexed pin that is programmed as a scan enable pin when the IC is programmed into said scan test mode and that is programmed as a current test scan enable pin when the IC is programmed into said current test scan mode.

12. The IC of claim 11, further comprising:
said mode control circuit configured to program the IC into a current scan mode when said multiplexed pin is asserted to a first logic state and to enable said quiescent current test when said multiplexed pin is asserted to a second logic state when the IC is programmed into said current test scan mode; and
current test enable logic having inputs coupled to said mode control circuit and said multiplexed pin and an output providing said freeze signal, wherein said current test enable logic asserts said freeze signal to enable said quiescent current test when the IC is programmed into said current test scan mode and when said multiplexed pin is asserted to said second logic state.

13. A method of configuring an integrated circuit (IC) to enable quiescent current measurement via a single supply pin relative to a reference pin, said method comprising:
providing a voltage converter that converts a supply voltage received via the single supply pin to an internal output voltage at a predetermined voltage level as controlled by a control voltage;
providing a voltage control node that develops the control voltage when driven and that temporarily maintains the control voltage sufficient for the quiescent current measurement when not driven;
providing a voltage controller that is coupled to the single supply pin and that drives the voltage control node to regulate the internal output voltage at the predetermined voltage level; and
providing a test mode circuit that detects a quiescent current test mode, and that disables the voltage controller and decouples the voltage controller from the voltage control node to enable the quiescent current measurement when the quiescent current test mode is detected.

14. The method of claim 11, further comprising:
providing a sense circuit that is coupled to the voltage converter to provide a feedback sense voltage to the voltage controller; and
configuring the test mode circuit to disable the sense circuit from providing the feedback sense voltage when the quiescent current test mode is detected.

15. The method of claim 11, further comprising configuring the voltage controller to tri-state its output driving the voltage control node when the voltage controller is disabled.

16. The method of claim 11, further comprising coupling a capacitor to the voltage control node.

17. The method of claim 16, further comprising:
coupling a first multiplexed pin on the IC to the test mode circuit; and
configuring the test mode circuit to enable the IC to be programmed via the first multiplexed pin into at least one test mode including a current test mode for enabling the quiescent current measurement, and to switch the first multiplexed pin to operate as a test function pin after the IC is programmed into the at least one test mode.

18. The method of claim 17, further comprising:
providing a second multiplexed pin;
presetting a first storage device of sequential logic of the IC to output a first logic state;
presetting a second storage device of the sequential logic of the IC to output a second logic state which is different from the first logic state;
coupling the second multiplexed pin to select logic when the IC is programmed into said at least one test mode; and
configuring the select logic to select between the outputs of the first and second storage devices based on a test mode validation signal provided on the second multiplexed pin and to provide the selected output to the first multiplexed pin when the IC is programmed into the at least one test mode.

19. The method of claim 13, further comprising:
configuring the test mode circuit to program the IC into a selected one of a scan test mode and at least one current test mode including the quiescent current test mode; and
providing a multiplexed pin to operate as a scan enable pin when the IC is programmed into the scan test mode and to operate as a current test enable pin when the IC is programmed into the at least one current test mode.

20. The method of claim 19, further comprising configuring the test mode circuit to operate the IC in a current scan mode when the multiplexed pin is asserted to a first logic state and to enable the quiescent current test mode when the multiplexed pin is asserted to a second logic state when the IC is programmed into the at least one current test mode.

* * * * *

UNITED STATES PATENT AND TRADEMARK OFFICE
CERTIFICATE OF CORRECTION

PATENT NO.         : 7,274,203 B2
APPLICATION NO. : 11/257706
DATED                 : October 25, 2005
INVENTOR(S)       : Kenneth Paul Tumin et al.

It is certified that error appears in the above-identified patent and that said Letters Patent is hereby corrected as shown below:

In Column 19, Line 1, Claim 14,
    Change "of claim 11" to --of claim 13--.

In Column 19, Line 8, Claim 15,
    Change "of claim 11" to --of claim 13--.

In Column 19, Line 11, Claim 16,
    Change "of claim 11" to --of claim 13--.

Signed and Sealed this

Seventeenth Day of February, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,274,203 B2  Page 1 of 1
APPLICATION NO. : 11/257706
DATED : September 25, 2007
INVENTOR(S) : Kenneth Paul Tumin et al.

It is certified that error appears in the above-identified patent and that said Letters Patent is hereby corrected as shown below:

In Column 19, Line 1, Claim 14,
    Change "of claim 11" to --of claim 13--.

In Column 19, Line 8, Claim 15,
    Change "of claim 11" to --of claim 13--.

In Column 19, Line 11, Claim 16,
    Change "of claim 11" to --of claim 13--.

This certificate supersedes the Certificate of Correction issued February 17, 2009.

Signed and Sealed this

Seventeenth Day of March, 2009

JOHN DOLL
*Acting Director of the United States Patent and Trademark Office*